(12) United States Patent
Dohle et al.

(10) Patent No.: US 8,450,611 B2
(45) Date of Patent: May 28, 2013

(54) CONNECTING WIRE AND METHOD FOR MANUFACTURING SAME

(75) Inventors: Rainer Dohle, Naila (DE); Frank Rudolf, Altenberg (DE); Christian Wenzel, Dresden (DE)

(73) Assignee: Heraeus Materials Technology GmbH & Co. KG, Hanau (DE)

( * ) Notice: Subject to any disclaimer, the term of this patent is extended or adjusted under 35 U.S.C. 154(b) by 624 days.

(21) Appl. No.: 12/607,225

(22) Filed: Oct. 28, 2009

(65) Prior Publication Data

US 2010/0108359 A1 May 6, 2010

(30) Foreign Application Priority Data

Oct. 31, 2008 (DE) .................... 10 2008 043 361

(51) Int. Cl.
*H01R 4/62* (2006.01)
(52) U.S. Cl.
USPC ...................... 174/94 R; 174/126.2
(58) Field of Classification Search
USPC ............ 174/36, 94 R, 126.1, 126.2; 228/101; 438/687; 257/758, 761, 762, 751
See application file for complete search history.

(56) References Cited

U.S. PATENT DOCUMENTS

| | | | |
|---|---|---|---|
| 3,410,715 A | 11/1968 | Hough | |
| 5,031,821 A | 7/1991 | Kaneda et al. | |
| 5,431,953 A | 7/1995 | Lyshkow | |
| 5,565,378 A | 10/1996 | Harada et al. | |
| 6,117,769 A | 9/2000 | Nogami et al. | |
| 6,423,625 B1 | 7/2002 | Jang et al. | |
| 6,916,739 B2 | 7/2005 | Ramm | |
| 7,538,434 B2 * | 5/2009 | Shih et al. | 257/751 |
| 7,820,913 B2 * | 10/2010 | Uno et al. | 174/94 R |
| 2002/0005582 A1 * | 1/2002 | Nogami et al. | 257/758 |
| 2003/0173659 A1 * | 9/2003 | Lee et al. | 257/690 |
| 2004/0173906 A1 * | 9/2004 | Saito et al. | 257/758 |
| 2005/0151264 A1 * | 7/2005 | Saito et al. | 257/762 |
| 2007/0284415 A1 * | 12/2007 | Hosseini | 228/101 |
| 2008/0076251 A1 | 3/2008 | Bischoff et al. | |

FOREIGN PATENT DOCUMENTS

| | | |
|---|---|---|
| DE | 43 03 401 A1 | 8/1993 |
| DE | 42 32 745 C2 | 3/1994 |
| DE | 102 61 436 A1 | 10/2003 |
| DE | 602 02 208 T2 | 12/2005 |
| DE | 10 2005 011 028 A1 | 9/2006 |
| DE | 10 2006 023 167 B3 | 12/2007 |
| DE | 10 2006 060 899 A1 | 7/2008 |

* cited by examiner

*Primary Examiner* — William H Mayo, III
(74) *Attorney, Agent, or Firm* — Panitch Schwarze Belisario & Nadel LLP

(57) ABSTRACT

A connecting wire having an electrically conductive core, preferably provided by a wire or ribbon, with a coating provided on the surface of the core. The coating is composed of a nitrogen-containing tantalum alloy or tungsten alloy, and also optionally contains silicon as an additional alloy component. A manufacturing method for producing such a connecting wire involves passing a wire or ribbon core past a coating source to apply the coating.

21 Claims, 2 Drawing Sheets

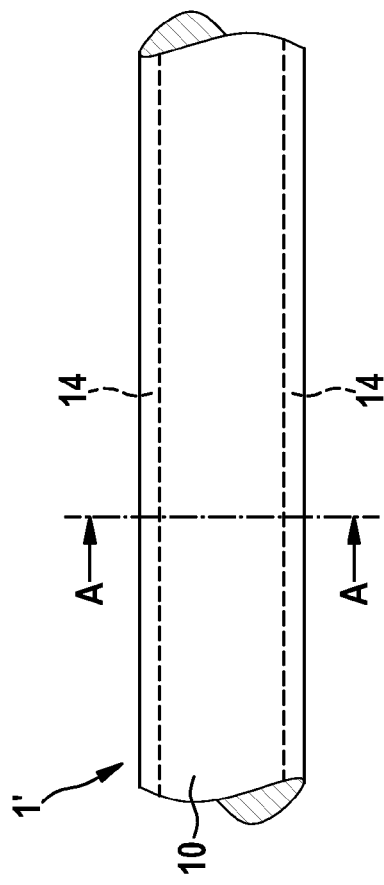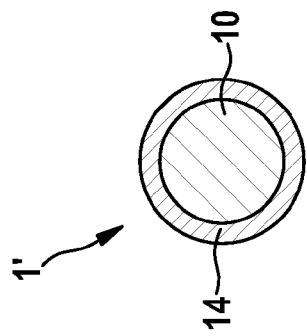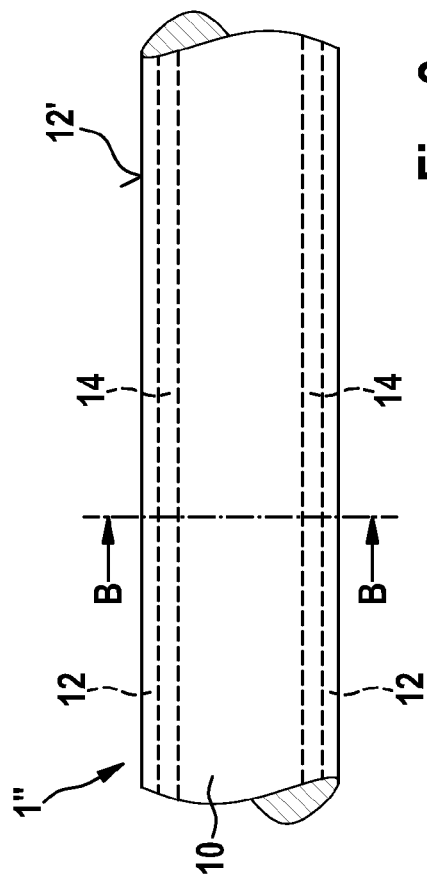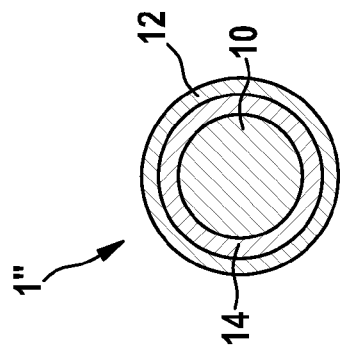

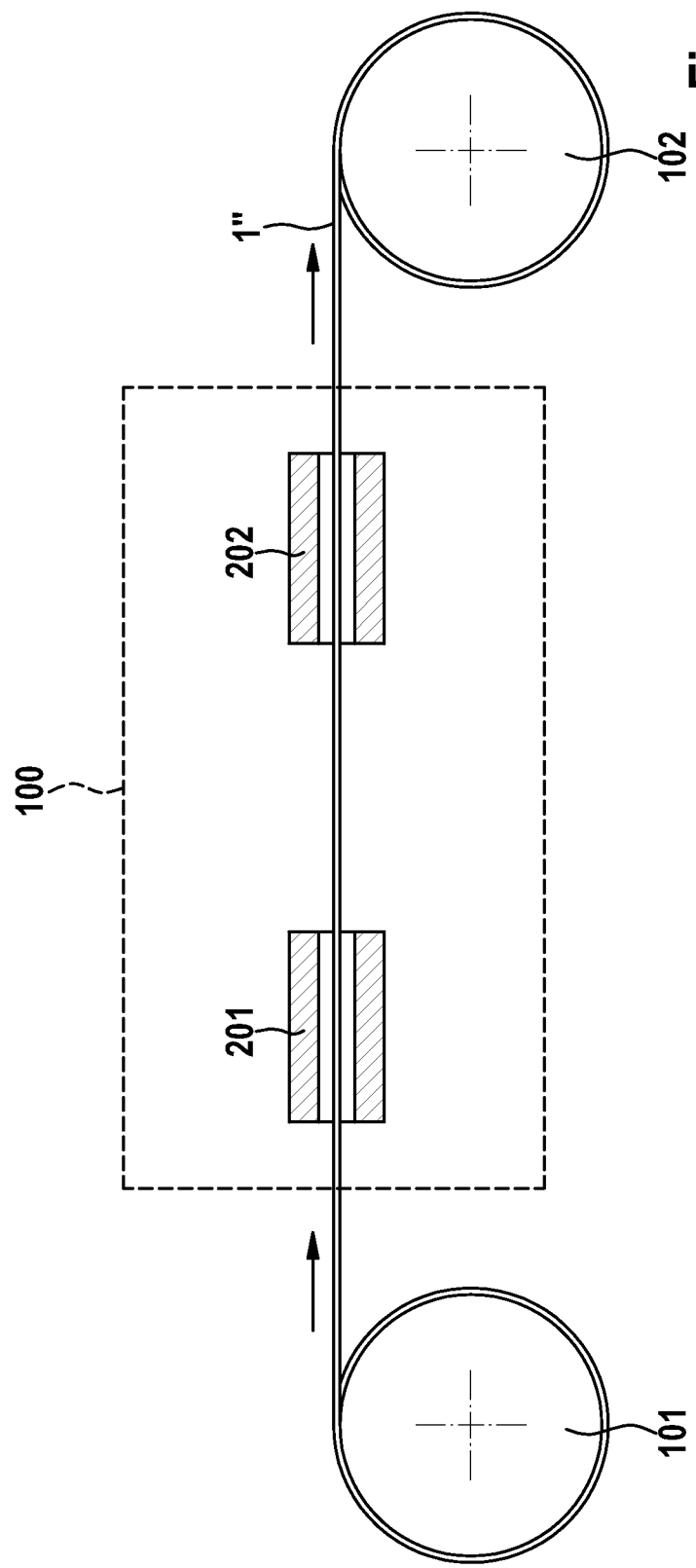

CONNECTING WIRE AND METHOD FOR MANUFACTURING SAME

FIELD OF THE INVENTION

The invention relates to a connecting wire which may be ultrasonically bonded to an electrically conductive core wire, with the connecting wire preferably being in the form of a round wire having a circular or elliptical cross section, or in the form of a ribbon preferably having an essentially rectangular cross section, and the electrically conductive core wire preferably being made of gold and/or a gold alloy and/or copper and/or a copper alloy, with a coating preferably being provided on the surface of the core. The invention further relates to a method for manufacturing such a connecting wire.

BACKGROUND OF THE INVENTION

Connecting wires are often used to mechanically and electrically connect a semiconductor chip to a substrate or wiring board. This electrical connection joins the connection surfaces of the semiconductor chip to the strip conductors situated on the substrate/wiring board. For this reason, materials with good electrical conductivity, such as gold, a gold alloy, copper, or a copper alloy, are often used.

Bonding processes are often used for attachment and connection of connecting wires to a substrate or semiconductor chip. Bonding processes (more precisely, wire bonding processes) refer to connection techniques in electrical engineering in which a connection is established between a chip and a wiring board, using a thin wire (connecting wire), and the wire is welded to the connection surface. The welding may be performed, for example, by thermal activation (thermosonic bonding) or by ultrasound (ultrasonic or US bonding), with the advantage that when aluminum wire is used, ultrasonically assisted wire bonding allows a bond connection to be made at room temperature. The electronic elements are thus protected from overheating. A further advantage of US bonding at room temperature is that it is not necessary to heat components having large volumes (and which are thus difficult to heat), thereby reducing manufacturing time and saving energy.

Coated connecting wires represent a refinement of such wires for better utilization in the US bonding process. In this process, core wires made of highly conductive material are coated to assist with US bonding.

Various types of coated connecting wires and bonding processes for same are known. DE 42 32 745 C2 describes a connecting wire which may be attached to a component by ultrasonic bonding. The known connecting wire has a core made of gold or copper, and a coating of aluminum or aluminum oxide which is applied to this core, the coating having an average layer thickness of 5 nm to 100 nm. The connecting wire with the coating allows a secure bond connection at room temperature, in particular for ultrasonic bonding. A current disadvantage of this connecting wire is the reduced service life of the US bonding tool compared to uncoated wire as the result of deposits of coating material on the bonding tool.

The connecting wire known from DE 10 2006 023 167 B3, in which a softer material is provided on a harder core, has the same disadvantages. Here as well, deposits of the coating material on the bonding tool are observed, resulting in reduced tool service life and/or imprecision in the bonding process.

A semiconductor component having a bonding island and a terminal which is connected to the semiconductor chip bonding island via a coated copper connecting wire is known from DE 102 61 436 A1. The coating is an oxidation protective layer composed of palladium or platinum. This technical approach can be used only in the so-called ball bonding process, in which the wire end is melted before a bonding operation in order to form a droplet with better bonding capability. For this purpose, oxidation of the surface must be avoided.

Bonding wire which likewise is usable only by means of a ball or wedge bonding process, as well as manufacture and use thereof, is known from DE 10 2005 011028 A1. A copper connecting wire in which gold is enriched in the surface is disclosed therein.

On the basis of these references, there is a desire to provide a connecting wire which on the one hand allows a high degree of security and reliability in ultrasonic bonding, and on the other hand allows economical and problem-free production of electronic components and assemblies. There is a further desire for connecting wires which may be easily and reliably bonded and which have little or no limitations in functionality as a mechanical and electrical connection.

SUMMARY OF THE INVENTION

The foregoing issues are addressed by a connecting wire having an electrically conductive core, designed as a core wire or core ribbon, with a coating provided on the surface of the core which is composed of a tantalum or tungsten alloy containing nitrogen and optionally silicon as additional alloy components. The coating is preferably composed of a tantalum-nitrogen (TaN) alloy, a tantalum-silicon-nitrogen (TaSiN) alloy, or a tungsten-silicon-nitrogen (TSiN) alloy. The alloy is particularly preferably composed of tantalum, silicon, and nitrogen in an atomic ratio of 58:16:26 ($Ta_{58}Si_{16}N_{26}$). The coating composed of the tantalum or tungsten alloy is preferably harder relative to the core. In this manner impurities are avoided, tool service life is increased, and manufacture is less costly.

The coating composed of the tantalum or tungsten alloy preferably has a thickness of 2 nm to 100 nm, particularly preferably 5 nm to 50 nm. As a result, interfering influences of the coating on the conductivity of the connecting wire are minimized, or are acceptable enough to allow problem-free functioning and high long-term reliability of the components or assemblies produced using the bonding wire.

The bondable layer of the connecting wire has an oxide layer containing the elements silicon and/or tantalum in its outer surface region and in a thin layer directly beneath the surface. A surprising effect of using this layer system is less material buildup, i.e., fewer deposits of wire material on the bonding tool. As a result, the service life of the bonding tool is greatly increased.

The surface is accordingly defined as an outer surface, i.e., the surface of the coating facing away from the core. The surface region also includes a section, pointing in the direction of the core, having a thickness of several atom layers, preferably a thickness of approximately 2 to 200 atom layers.

In another preferred version of the invention, a bondable layer containing aluminum is provided on the surface of the coating opposite from the core. In this manner a secure and reliable bond connection is achieved at a temperature below 120° C., or even at room temperature. It is further preferred that this bondable layer has a dense aluminum oxide ($Al_2O_3$) layer in its outer surface region. This layer is not harmful, and even has a favorable influence on the bonding capability because of its sandpaper-like effect which produces a secure bond connection to the bonding partner, even at room temperature, due to the fact that surface layers only a few atom layers thick, composed of natural contaminants such as carbon compounds, water, or other contaminant layers which are always present at room temperature, on the bonding island are ablated. The bonding below 120° C. or at room temperature is thus further facilitated. This allows mechanical and electrical connections to connecting wires to be established without problems.

The surface of the bondable layer is accordingly defined as an outer surface, i.e., the surface facing away from the tantalum or tungsten coating and on which the bonding process is performed, establishing a connection to a bonding island. The surface region also includes a section, pointing in the direction of the core, having a thickness of several atom layers, preferably a thickness of approximately 2 to 200 atom layers.

The bondable aluminum layer preferably has a layer thickness between 2.5 nm and 50 nm, preferably between 6 nm and 40 nm, particularly preferably between 7 nm and 35 nm. A limited layer thickness of the aluminum coating advantageously influences the tool service life during production. Contamination of the bonding tool may be kept so low, with minimal layer thickness of the relatively soft aluminum, that replacement intervals for the tools may be greatly extended. In this manner capacity utilization of the automatic bonding machines, and thus manufacturing efficiency, are increased.

More preferably, the layer thickness of the referenced coatings may be a function of the wire diameter, i.e., the thickness of the core wire or the core ribbon. Thus, the coating composed of the tantalum or tungsten alloy has a layer thickness in the range of 0.025% to 0.075%, preferably 0.05%, of the core wire diameter, and/or the bondable layer has a layer thickness in the range of 0.0125% to 0.0375%, preferably 0.025%, of the core wire diameter. Alternatively, the coating composed of the tantalum or tungsten alloy has a layer thickness of 0.025% to 0.075%, preferably 0.05%, of the thickness of the core ribbon, and/or the bondable layer has a layer thickness of 0.0125% to 0.0375%, preferably 0.025%, of the thickness of the core ribbon. This further improves the problem-free functioning of the connecting ribbon or connecting wire as a mechanical and electrical connection.

Such a connecting wire enables the desired secure and reliable bond connection, and at the same time ensures a long tool service life. In this regard, the bond connection is so reliable that the substrates/wiring boards may be securely bonded below a temperature of 120° C., or even at room temperature. This means that even heat-sensitive substrates may be bonded using the connecting wire according to the invention without the need for heating. Besides silicon semiconductors, heat-sensitive semiconductive materials, for example semiconductor lasers based on GaA or InP lasers for optoelectronic components, may also be reliably bonded.

A further advantage is the longer storage life of the wires according to the invention compared to wires corresponding to the prior art.

Furthermore, more favorable HF (high frequency) and microwave properties may be realized for components connected using the connecting wires according to the invention.

One objective of the invention's manufacturing methods for the connecting wires is to design these methods in a simple and economical manner with the aim of manufacturing great lengths of such connecting wires in a short period of time. This objective can be achieved using manufacturing methods having the following steps:

Unwinding the core material in the form of a wire from a wind-out reel, and

Coating the core wire by leading the core wire past a first coating source of a coating unit to produce the coating composed of a tantalum or tungsten alloy.

The unwound wire may optionally be cleaned immediately before the coating process, preferably using in situ ion physical cleaning without vacuum interruption.

The method preferably includes a second coating step following the aforementioned (first) coating step, in which the core wire having a coating of tantalum or tungsten alloy is led past a second coating source of the coating unit to produce a bondable layer preferably made of aluminum.

The coating unit is designed as a CVD or PVD unit, the bondable layer particularly preferably being applied using vacuum technology, for example by sputtering. It is particularly preferred to use tubular or annular sputtering targets, or sputtering targets in the form of a square profile.

The coating unit may be divided into two parts, or two separate coating units may be used. In this case the coating unit may be designed as one CVD unit and one PVD unit, i.e., the two separate coating units may operate by means of different coating techniques.

Following one or both of the above-referenced coating steps, the connecting wire may optionally be rewound on a wind-up reel on which the connecting wire may be subsequently marketed. The second coating step may preferably be followed by a further process in which the aluminum-coated connecting wire is treated with oxygen in a targeted manner to obtain a well-defined aluminum oxide layer on an outer surface region. Following this step the connecting wire may be wound up and optionally vacuum-packed.

A tempering step is preferably performed after the first and/or the second coating step. This prevents the hardness of the connecting wire from changing after application of the coating(s).

Such a method is simple and economical because the processes have an uncomplicated design with few steps. Unwinding directly from a wind-out reel allows great lengths of connecting wires to be manufactured in a short period of time, and the coating parameters may be easily adjusted. The duration of the coating is correlated, for example, with the desired layer thickness of the bondable coating.

Further objectives, features, advantages, and possible applications of the invention result from the following description of exemplary versions of the invention, with reference to the figures. All described and/or graphically illustrated features, taken alone or in any given combination, constitute the subject matter of the present invention.

BRIEF DESCRIPTION OF THE DRAWINGS

The drawings depict exemplary versions of a connecting wire having a core composed of round wire, wherein:

FIG. 1a shows a connecting wire having a surface layer of TaSiN or TaN;

FIG. 1b shows a section of the connecting wire along section line A from FIG. 1a;

FIG. 2a shows another version of the connecting wire having an intermediate layer of TaSiN or TaN and a surface layer of surface-oxidized aluminum;

FIG. 2b shows a section of the connecting wire along section line B from FIG. 2a; and FIG. 3 shows a device for manufacturing a connecting wire according to the invention, corresponding to FIGS. 2a and 2b for illustration of the manufacturing method.

DETAILED DESCRIPTION OF PREFERRED VERSIONS OF THE INVENTION

FIGS. 1a and 1b show a connecting wire 1' according to a first version of the invention.

The core wire 10 is at least predominantly composed of relatively soft but highly conductive gold and/or a gold alloy, and/or copper and/or a copper alloy, whereas the coating 12 is composed of a tantalum or tungsten alloy containing nitrogen and optionally silicon as additional alloy components.

FIGS. 2a and 2b show a connecting wire 1" according to a second version of the invention, having a core wire 10, composed predominantly of relatively soft but highly conductive gold and/or a gold alloy, and/or copper and/or a copper alloy, having a thin coating 14. The coating 14 is designed as an intermediate layer, and is composed of a tantalum or tungsten alloy containing nitrogen and optionally silicon as additional alloy components. On the surface of the coating 14 opposite the core wire 10 the connecting wire 1" has a bondable coating 12 containing aluminum. The coating 12 may have an aluminum oxide layer 12' at the outer surface or in the region of the surface. This layer 12' may have a thickness of several atom layers.

The coating 14 generally has a thickness between 2 nm and 100 nm, preferably between 5 nm and 50 nm. The bondable coating 12 has a layer thickness between 2.5 nm and 50 nm, preferably between approximately 6 nm and 40 nm, particularly preferably between approximately 7 nm and 35 nm. It is also possible for the layer thickness of the coating and of the bondable layer to be a function of the thickness, i.e., the wire diameter, of the core wire.

FIG. 3 shows a coating unit 100 for coating a connecting wire 1" according to FIGS. 2a and 2b for illustration of the manufacturing method. The material of the core in the form of a wire 10 is unwound from a wind-out reel 101, and at the end of the manufacturing process is optionally wound up on a wind-up reel 102. The wire 10 moves in the direction of the arrow as indicated in FIG. 3.

In a first step the wire 10 is led through a first tubular sputtering target 201 in which the coating 14 is applied. The wire which has been provided with the coating 14 is then led through a second, likewise tubular, sputtering target 202 for application of the bondable layer 12.

Downstream from the sputtering target 202, and in the manufacturing method, after the second coating step, a tempering unit may be provided, either inside or outside the coating unit 100 and before the connecting wire is wound onto the wind-up reel 102, which is used to perform a tempering step after the wire is coated. Such a tempering step is used for the hardening treatment of the connecting wire. An additional tempering unit may be situated between the sputtering targets 201 and 202.

Wire cleaning in a vacuum process may be carried out between the wind-out reel 101 and the coating unit 100.

The connecting wires according to the invention may be bonded using ultrasound at temperatures below 120° C., or even at room temperature, and allow an improved service life of the bonding tool.

It will be apparent that numerous modifications and variations of the described examples and versions of the invention are possible in light of the foregoing discussion. The disclosed examples and versions of the invention are presented for purposes of illustration only. This patent encompasses all such modifications and alternate versions as may come literally or equivalently within the scope of the claims below.

What is claimed is:

1. A connecting wire having:
   a. an electrically conductive core, and
   b. a coating provided on the surface of the core, wherein the coating includes one or more of:
      (1) a nitrogen-containing alloy of tantalum, and
      (2) a nitrogen-containing alloy of tungsten; and
   c. a bonding layer provided on the surface of the coating opposite from the core, wherein the bonding layer includes aluminum.

2. The connecting wire of claim 1 wherein at least one of the nitrogen-containing alloys within the coating further contains silicon as an alloy component.

3. The connecting wire of claim 1 wherein the coating includes one or more of
   a. TaSiN and
   b. WSiN.

4. The connecting wire of claim 1 wherein the coating includes Ta58Si16N26.

5. The connecting wire of claim 1 wherein the coating has a thickness of 2 nm to 100 nm.

6. The connecting wire of claim 1 wherein the coating has a thickness of 5 nm to 50 nm.

7. The connecting wire of claim 1 wherein the bonding layer includes aluminum oxide in its outer surface.

8. The connecting wire of claim 1 wherein the bonding layer has a thickness between 2.5 nm and 50 nm.

9. The connecting wire of claim 1 wherein the bonding layer has a thickness between 6 nm and 40 nm.

10. The connecting wire of claim 1 wherein the bonding layer has a thickness between 7 nm and 35 nm.

11. The connecting wire of claim 1 wherein the core is formed from a wire or a ribbon.

12. The connecting wire of claim 1 wherein:
    a. the core is formed from a wire, and
    b. the coating has a thickness of 0.025% to 0.075% of the core wire diameter.

13. The connecting wire of claim 1:
    a. wherein the core is formed from a wire, and
    b. wherein the bonding layer
       has a thickness of 0.0125% to 0.0375% of the diameter of the core wire.

14. The connecting wire of claim 1 wherein:
    a. the core is formed from a ribbon, and
    b. the coating has a thickness of 0.025% to 0.075% of the thickness of the core ribbon.

15. The connecting wire of claim 1:
    a. wherein the core is formed from a ribbon, and
    b. wherein the bonding layer
       has a thickness of 0.0125% to 0.0375% of the thickness of the core ribbon.

16. A method for manufacturing a connecting wire having:
    I. an electrically conductive core, and
    II. a coating provided on the surface of the core, wherein the coating includes one or more of:
       A. a nitrogen-containing alloy of tantalum, and
       B. a nitrogen-containing alloy of tungsten, the method including the steps of:
          a. unwinding the core from a wind-out reel,
          b. passing the core past a first coating source, the first coating source applying the coating, and
          c. passing the core past a second coating source, the second coating source applying a bonding layer containing aluminum on the surface of the coating opposite from the core.

17. The method of claim 16 wherein the first coating source includes at least one of:
    a. a CVD unit, and
    b. a PVD unit.

18. The method of claim 16 wherein:
    a. the core is provided in the form of a wire or ribbon, and
    b. wherein the step of passing the core past a first coating source includes passing the core within one or more of:
       c. a tubular or annular sputtering target, and
       d. a rectangular sputtering target.

19. The method of claim 16 further including the step of vacuum cleaning of the core before passing the core past the first coating source.

20. The method of claim 19 wherein the vacuum cleaning step includes in situ ion physical cleaning without vacuum interruption.

21. The method of claim 16 further including the step of tempering the coated core.

* * * * *